(12) United States Patent
Wang et al.

(10) Patent No.: US 11,054,958 B2
(45) Date of Patent: Jul. 6, 2021

(54) APERATURE FILTERING FOR RESISTIVE MULTI-TOUCH DISTORTIONS

(71) Applicant: Texas Instruments Incorporated, Dallas, TX (US)

(72) Inventors: Ing-Yih J. Wang, Tucson, AZ (US); Herbert Braisz, Tucson, AZ (US); Tony Chang, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 976 days.

(21) Appl. No.: 15/348,734

(22) Filed: Nov. 10, 2016

(65) Prior Publication Data

US 2017/0060330 A1    Mar. 2, 2017

Related U.S. Application Data

(62) Division of application No. 13/828,561, filed on Mar. 14, 2013, now abandoned.

(Continued)

(51) Int. Cl.
*G06F 3/045* (2006.01)
*G06F 3/041* (2006.01)
*H03K 17/96* (2006.01)

(52) U.S. Cl.
CPC ........ *G06F 3/045* (2013.01); *G06F 3/041661* (2019.05); *H03K 17/9647* (2013.01);
(Continued)

(58) Field of Classification Search
CPC ........ G06F 3/0416; G06F 3/044; G06F 3/045; G06F 2203/04104; G06F 2203/04105;
(Continued)

(56) References Cited

U.S. PATENT DOCUMENTS 6,492,979 B1    12/2002    Kent et al.
6,504,530 B1    1/2003     Wilson et al.
(Continued)

FOREIGN PATENT DOCUMENTS

WO    WO2010117946    10/2010
WO    WO2011087669    7/2011

*Primary Examiner* — Temesghen Ghebretinsae
*Assistant Examiner* — Karin Kiyabu
(74) *Attorney, Agent, or Firm* — Michael A. Davis. , Jr.; Charles A. Brill; Frank D. Cimino

(57) ABSTRACT

An apparatus comprises touch screen interface and signal processing circuit. Within touch screen interface, there are switching circuits configured to be coupled to at least one of a plurality of column electrodes, and there are touch detection circuits configured to be coupled to at least one of a plurality of row electrodes. The signal processing circuit is coupled to each switching circuit and each touch detection circuit so as to be able to selectively activate the plurality of switching circuits and touch detection circuits to identify a zone for a touch event. The signal processing circuit determines first, second, third, and fourth resistances for the zone for the touch event and determines a set of coordinates and pressure for the touch event from its first, second, third, and fourth resistances wherein an aperture filter register is in a host interface that also stores the first digital representation.

12 Claims, 11 Drawing Sheets

Related U.S. Application Data

(60) Provisional application No. 61/610,711, filed on Mar. 14, 2012.

(52) U.S. Cl.
CPC ............. *G06F 2203/04104* (2013.01); *G06F 2203/04105* (2013.01)

(58) Field of Classification Search
CPC ...... G06F 3/047; G06F 3/0418; G06F 3/0446; G06F 3/041661; H03K 17/9647; H04B 1/0475; G01R 29/26
See application file for complete search history.

(56) References Cited

U.S. PATENT DOCUMENTS

| | | | |
|---|---|---|---|
| 6,611,257 B1 * | 8/2003 | Dotson | G06F 3/038 178/18.05 |
| 2008/0224912 A1 * | 9/2008 | Wang | G06F 3/0418 341/155 |
| 2008/0296073 A1 | 12/2008 | McDermid | |
| 2009/0174679 A1 * | 7/2009 | Westerman | G06F 3/0416 345/173 |
| 2010/0079397 A1 * | 4/2010 | Yang | G06F 3/0416 345/173 |
| 2010/0097343 A1 * | 4/2010 | Fang | G06F 3/0416 345/174 |
| 2010/0110039 A1 | 5/2010 | Li | |
| 2012/0200524 A1 * | 8/2012 | Vallis | G06F 3/044 345/174 |

* cited by examiner

CENTER CODE DEFINITION

| (X1, Y1) ● | (X2, Y1) ● | (X3, Y1) ● |
|---|---|---|
| (X1, Y2) ● | (X2, Y2) ● | (X3, Y2) ● |
| (X1, Y3) ● | (X2, Y3) ● | (X3, Y3) ● |
| (X1, Y4) ● | (X2, Y4) ● | (X3, Y4) ● |
| (X1, Y5) ● | (X2, Y5) ● | (X3, Y5) ● |

FIG. 8A

APERTURE FILTER REGISTER PAGE

| | 15    11 | 7 | 0 |
|---|---|---|---|
| 0 | 00000 | 0000 | WX |
| 1 | 00001 | X1 | |
| 2 | 00010 | X2 | |
| ○○○ | ○○○ | ○○○ | |
| 15 | 01111 | X15 | |
| 16 | 10000 | 0000 | WY |
| 17 | 10001 | Y1 | |
| ○○○ | ○○○ | ○○○ | |
| 31 | 11111 | Y15 | |

FIG. 8B

INTERNAL REGISTER MAP

| REGISTER ADDRESS | | | | REGISTER CONTENT | READ/WRITE |
|---|---|---|---|---|---|
| A3 | A2 | A1 | A0 | | |
| 0 | 0 | 0 | 0 | INDEX REGISTER (INDEX DETECTED). WRITE X-INDEX FOR SINGLE COMMAND | R/W |
| 0 | 0 | 0 | 1 | X MEASUREMENT RESULT | R |
| 0 | 0 | 1 | 0 | Y MEASUREMENT RESULT. WRITE Y-INDEX FOR SINGLE COMMAND | R/W |
| 0 | 0 | 1 | 1 | Z1 MEASUREMENT RESULT | R |
| 0 | 1 | 0 | 0 | Z2 MEASUREMENT RESULT | R |
| 0 | 1 | 0 | 1 | READ: Temp1 MEASUREMENT RESULT. WRITE: PAGE ADDRESS FOR APERTURE FILTER CENTER CODES AND WINDOW SIZE WX, WY | R/W |
| 0 | 1 | 1 | 0 | Temp2 MEASUREMENT RESULT | R |
| 0 | 1 | 1 | 1 | STATUS | R |
| 1 | 0 | 0 | 0 | TREG0: AUX RESULT | R |
| 1 | 0 | 0 | 1 | TREG1: RESERVED | R |
| 1 | 0 | 1 | 0 | TREG2: AUX THRESHOLD | R/W |
| 1 | 0 | 1 | 1 | TREG3: TEMP THRESHOLD | R/W |
| 1 | 1 | 0 | 0 | CFR0. CFR0.D13: ENABLE/DISABLE APERTURE FILTER | R/W |
| 1 | 1 | 0 | 1 | CFR1 | R/W |
| 1 | 1 | 1 | 0 | CFR2 | R/W |
| 1 | 1 | 1 | 1 | CONVERTER FUNCTION SELECT STATUS | R |

FIG. 8D

APERATURE FILTERING FOR RESISTIVE MULTI-TOUCH DISTORTIONS

PRIORITY

This application is a division of U.S. patent application Ser. No. 13/828,561, "APERATURE FILTERING FOR RESISTIVE MULTI-TOUCH DISTORTIONS", filed Mar. 14, 2013, which claims the benefit of U.S. Provisional Application No. 61/610,711, "APERATURE FILTERING FOR RESISTIVE MULTI-TOUCH DISTORTIONS", filed Mar. 14, 2012, both of which are incorporated herein by reference in their entireties.

TECHNICAL FIELD

The invention relates generally to a touch screen controller and, more particularly, to a resistive touch screen controller.

BACKGROUND

Turning to FIG. 1, an example of a conventional 4-wire interface system 100 can be seen. When a touch event occurs on the touch screen 102, the pressure applied to the touch screen 102 allows the column and row sheets of the touch screen 102 to intersect at the location of the touch event. To resolve this location, the touch screen interface 108 (which generally resides in the touch screen controller 104 and which can includes drivers and switches) is able to selectively activate the row sheet or column sheet of the touch screen 102 so at to allow the analog-to-digital converter (ADC) 112 (which can, for example, be a successive approximation register (SAR) ADC) to measure the resistances of for the row and column sheets. The pre-processing circuit 114 is then able to store the measured (and digitized) resistances and interpolate the position of the touch event on the touch screen 102. This interpolated position can then be passed to the host processor 106 though the host interface 116 to a host processor 106.

With these types of systems (i.e., system 100), there are some drawbacks. First, it is difficult to resolve multiple, simultaneous touch events with conventional 4-wire or S-wire systems, usually requiring sophisticated algorithms to resolve the multiple, simultaneous touch events. Second, interpolation within the pre-processing circuit 114 can be costly in terms of power consumption and/or area. Therefore, there is a need for an improved resistive touch screen controller.

Some other conventional systems are: U.S. Pat. Nos. 6,492,979; 6,504,530; PCT Publ. No. WO2010117946; PCT Publ. No. WO2011087669; and Rick Downs, "Using resistive touch screens for human/machine interface," *TI Analog Applications Journal*, Third Quarter 2005.

SUMMARY

An embodiment of the present invention, accordingly, provides a method for determining respective first and second positions for first and second touch events that are substantially simultaneous on a touch screen having a plurality of zones. The method comprises identifying a first zone of the plurality of zones, wherein the first zone is associated with the first touch event; resolving the first position in the first zone by: activating a first column and a first row so as to measure first, second, third, and fourth resistances associated with the first touch event; generating a first digital representation for a first set of coordinates on the touch screen and a first pressure from a set of the first, second, third, and fourth resistances; storing the first digital representation; and deactivating the first column and the first row; identifying a second zone of the plurality of zones, wherein the second zone is associated with the second touch event; and resolving the second position in the first zone by: activating a second column and a second row so as to measure fifth, sixth, seventh, and eighth resistances associated with the second touch event; generating a second digital representation for a second set of coordinates on the touch screen and a second pressure from the fifth, sixth, seventh, and eighth resistances; storing the second digital representation; and deactivating the second column and the second row, and an aperture filter register is in a host interface that also stores the first digital representation.

In accordance with an embodiment of the present invention, the step of identifying the first zone further comprises performing a precharge and sensing operation for all zones to indicate the occurrence of the first touch event, and wherein the step of identifying the second zone further comprises performing a precharge and sensing operation for all zones to indicate the occurrence of the second touch event.

In accordance with an embodiment of the present invention, the step of generating a first digital representation further comprises: calculating a horizontal position in the first zone corresponding to the first touch event from the first resistance, wherein the horizontal position corresponds to a first coordinate from the first set of coordinates; calculating a vertical position in the first zone corresponding to the first touch event from the first resistance, wherein the vertical position corresponds to a second coordinate from the first set of coordinates; calculating a touch resistance from the horizontal position, the first resistance, the third resistance, and the fourth resistance; and calculating the first pressure from the touch resistance.

In accordance with an embodiment of the present invention, the step of generating a first digital representation further comprises: calculating a horizontal position in the first zone corresponding to the first touch event from the first resistance, wherein the horizontal position corresponds to a first coordinate from the first set of coordinates; calculating a vertical position in the first zone corresponding to the first touch event from the first resistance, wherein the vertical position corresponds to a second coordinate from the first set of coordinates; calculating a touch resistance from the horizontal position, the vertical position, the first resistance, the second resistance, the third resistance, and the fourth resistance; and calculating the first pressure from the touch resistance.

In accordance with an embodiment of the present invention, an apparatus is provided. The apparatus comprises a touch screen interface having: a plurality of switching circuits, wherein each switching circuit is configured to be coupled to at least one of a plurality of column electrodes; and a plurality of touch detection circuits, wherein each touch detection circuit is configured to be coupled to at least one of a plurality of row electrodes; and a signal processing circuit that is coupled to each switching circuit and each touch detection circuit, wherein the signal processing circuit is configured to selectively activate the plurality of switching circuits and the plurality of touch detection circuits to identify a zone for a touch event, and wherein the signal processing circuit is configured to determine first, second, third, and fourth resistances for the zone for the touch event, and wherein the signal processing circuit is configured to determine a set of coordinates and pressure for the touch event from its first, second, third, and fourth resistances; and aperture filter registers in a host interface.

In accordance with an embodiment of the present invention, the signal processing circuit is configured to calculate: a horizontal position in the zone corresponding to the touch event from the first resistance, wherein the horizontal position corresponds to a first coordinate from the set of coordinates; a vertical position in the zone corresponding to the touch event from the first resistance, wherein the vertical position corresponds to a second coordinate from the set of coordinates; a touch resistance from the horizontal position, the first resistance, the third resistance, and the fourth resistance; and the first pressure from the touch resistance.

In accordance with an embodiment of the present invention, the signal processing circuit further comprises: a multi-touch controller that is coupled to the touch screen interface; and a touch engine that is coupled to the touch screen interface and the multi-touch controller.

In accordance with an embodiment of the present invention, the signal processing circuit further comprises a host controller that is coupled to the touch engine.

In accordance with an embodiment of the present invention, the touch engine further comprises: an analog-to-digital converter (ADC) that is coupled to the plurality of touch detection circuits; a touch engine controller that is coupled to the multi-touch controller, the ADC, and the host interface; and a pre-processing circuit that is coupled to the touch engine controller and the host interface.

In accordance with an embodiment of the present invention, the host interface further comprises: an index register for storing the zone for the touch event; and a data register for storing digital representations of the first and second resistances for the touch event.

In accordance with an embodiment of the present invention, an apparatus is provided. The apparatus comprises a touch screen having: a plurality of column electrodes; and a plurality of row electrodes; a touch screen controller having: a touch screen interface having: a plurality of switching circuits, wherein each switching circuit is coupled to at least one of the column electrodes; and a plurality of touch detection circuits, wherein each touch detection circuit is coupled to at least one of the row electrodes; and a signal processing circuit that is coupled to each switching circuit and each touch detection circuit, wherein the signal processing circuit is configured to selectively activate the plurality of switching circuits and the plurality of touch detection circuits to identify a zone for a touch event, and wherein the signal processing circuit is configured to determine first, second, third, and fourth resistances for the zone for the touch event, and wherein the signal processing circuit is configured to determine a set of coordinates and pressure for the touch event from the first, second, third, and fourth resistances; and a host processor that is coupled to the signal processing circuit, and aperture filter register in a host interface.

In accordance with an embodiment of the present invention, the host interface further comprises an inter-integrated circuit (I2C) interface that is coupled to the host processor.

In accordance with an embodiment of the present invention, the touch screen has three columns and five rows.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 8A illustrates an example of the center code definition;

FIG. 8B illustrates an aperture filter register page that can store up to 15 X-coordinates and 15 Y-coordinates of center codes;

FIG. 8D illustrates an internal register map for configuring apertures;

DETAILED DESCRIPTION

Figure 1:
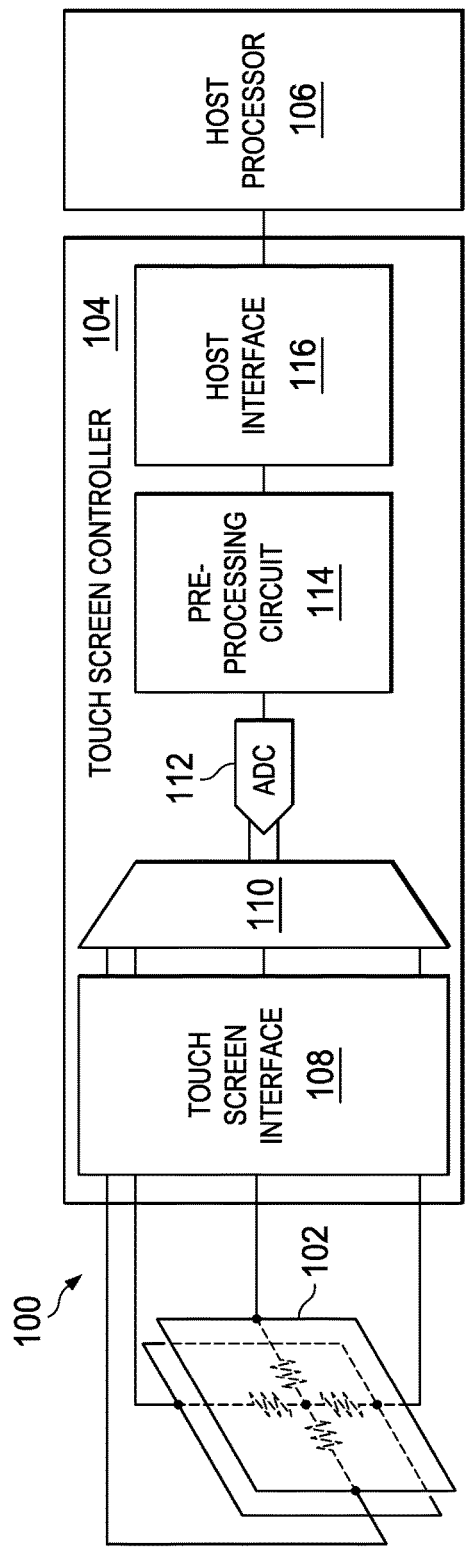
FIG. 1 is a diagram of an example of a conventional interface system.

Refer now to the drawings wherein depicted elements are, for the sake of clarity, not necessarily shown to scale and wherein like or similar elements are designated by the same reference numeral through the several views.

Figure 2:
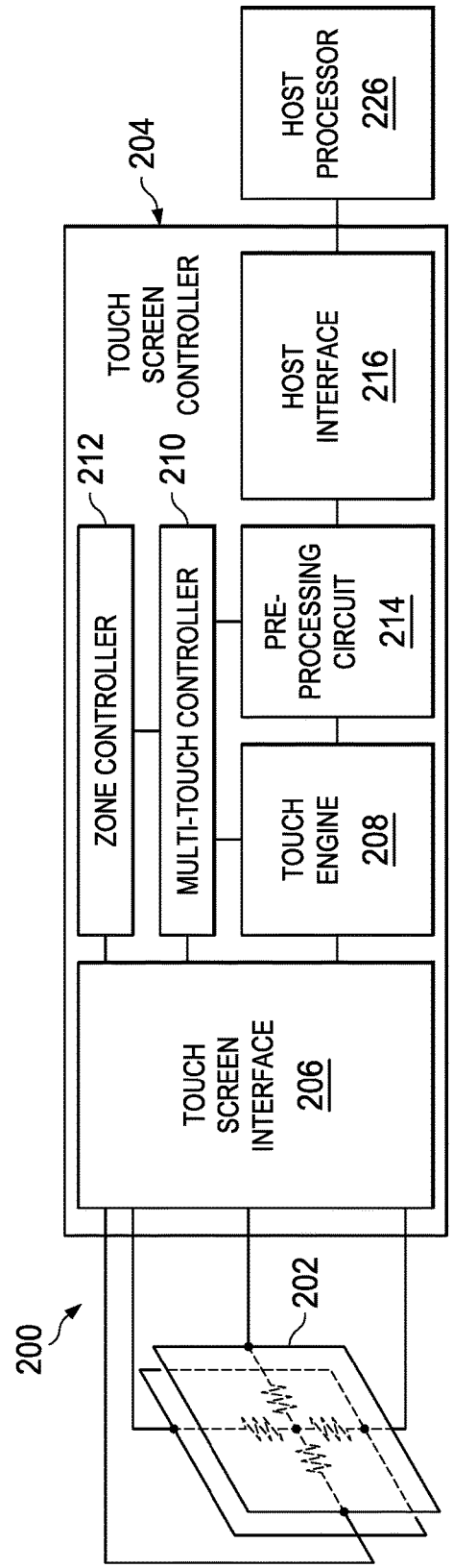
FIG. 2 is a diagram of an interface system in accordance with the present invention.
Figure 3A:
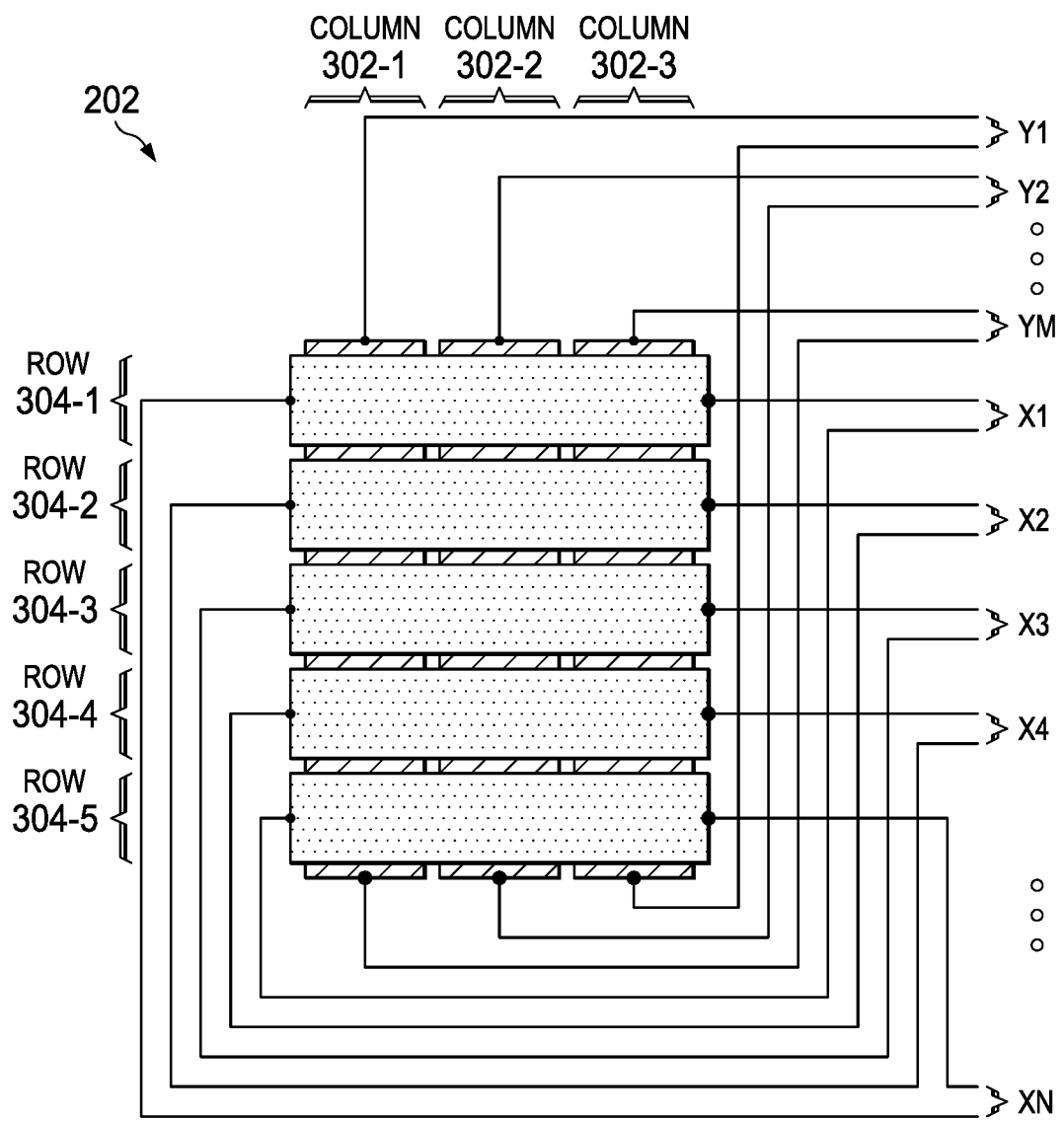
FIG. 3A and FIG. 3B are diagrams illustrating an example of the touch screen of FIG. 2.
Figure 3B:
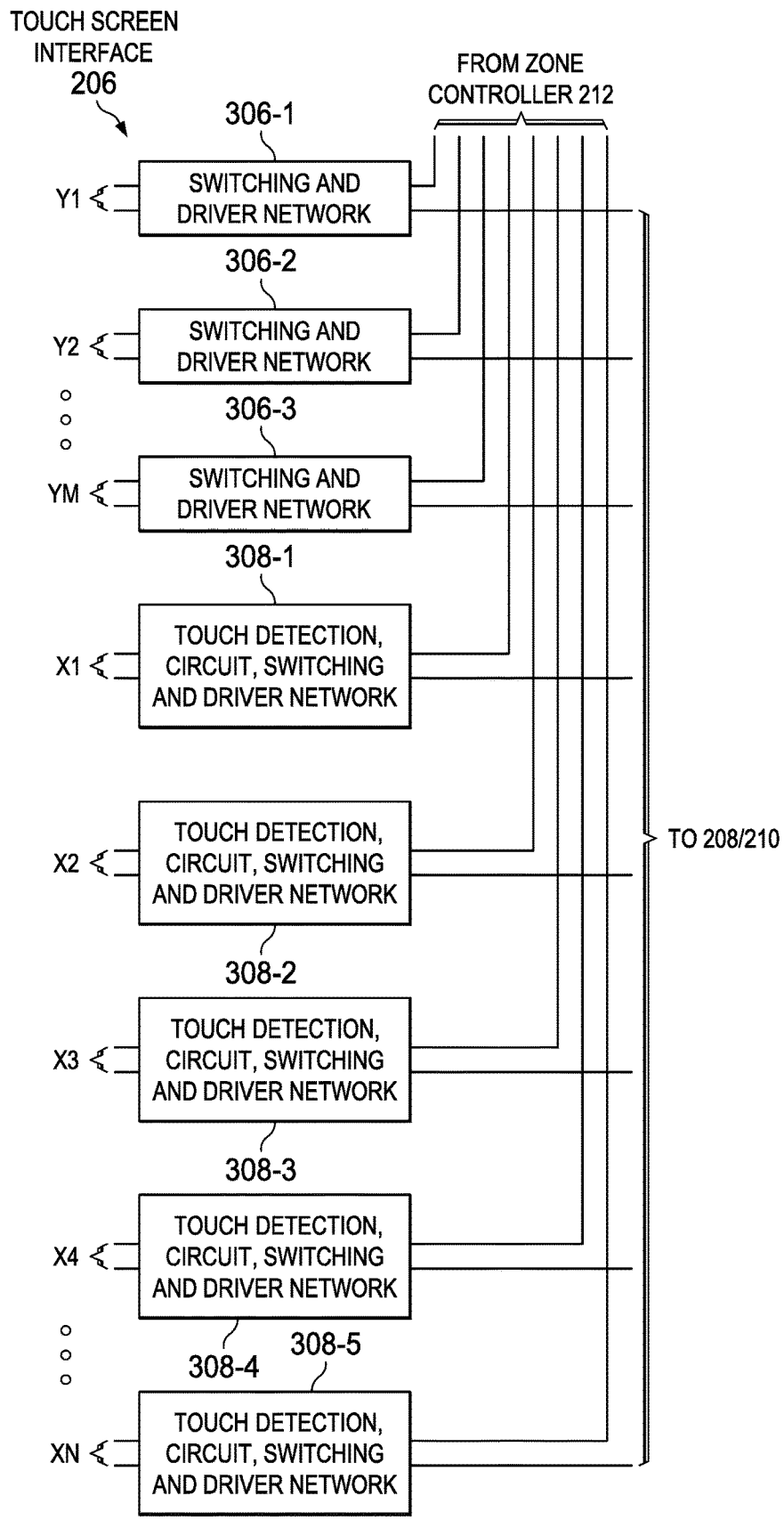
Figure 4:
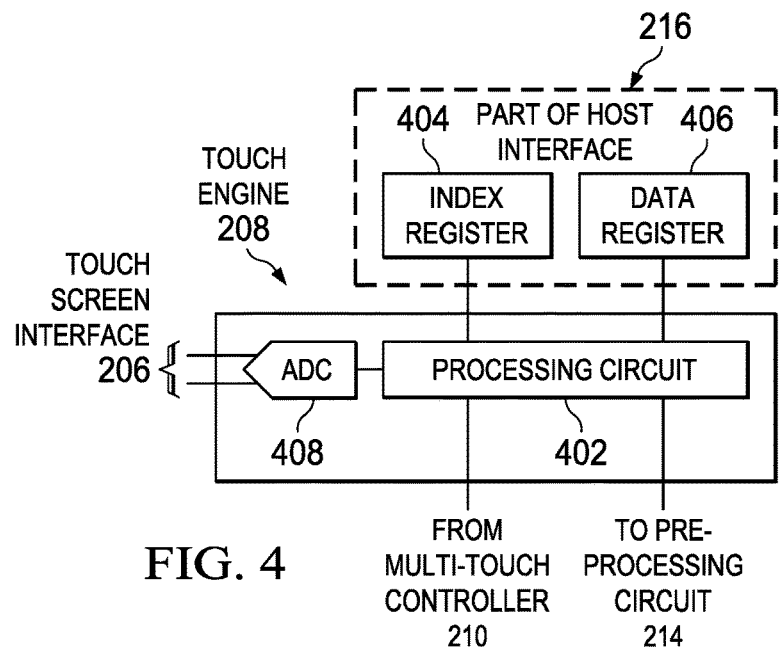
FIG. 4 is a diagram of an example of the touch screen interface of FIG. 2.
Figure 5:
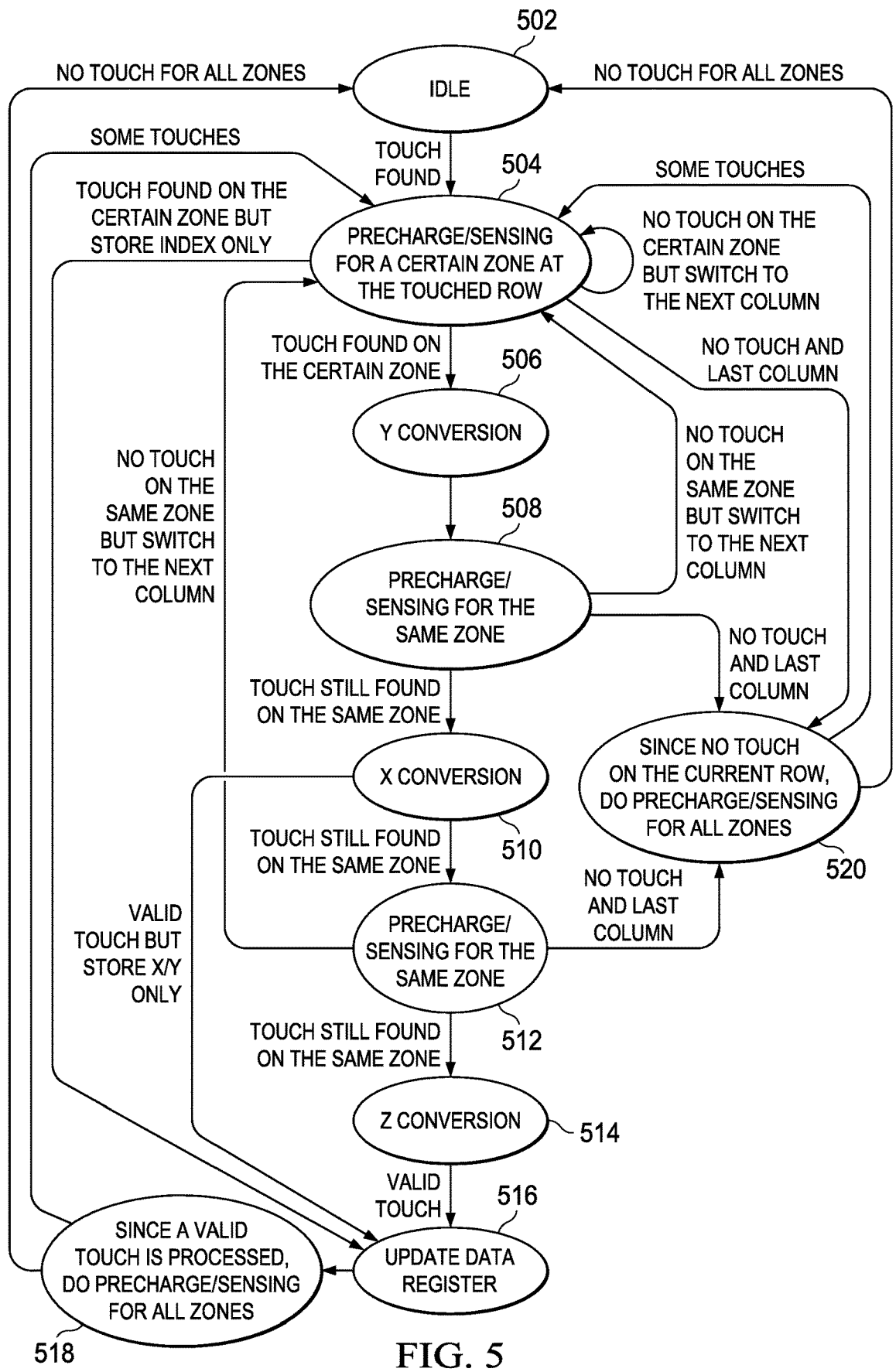
FIG. 5 is a diagram illustrating the touch engine and host interface of FIG. 2.

As shown in FIGS. 2-4, the touch screen 202 and touch screen interface 206 of interface system 200 have a different configuration than that of the touch screen 102 and interface 108 of system 100. In this example, the touch screen 202 is divided into a number of column electrodes 302-1 to 302-3 and row electrodes 304-1 to 304-5 that are formed resistive sheets. In this example, there are three column electrodes (i.e., 302-1 to 302-3) and five row electrodes (i.e. 304-1 to 304-5), but other numbers of row and column electrodes are possible. For example, the number of row electrodes and/or column electrodes may be increase to increase resolution by increasing the number of "zones" (i.e., intersections of column and row electrodes). Coupled to each column electrode 302-1 to 302-3 is a switching circuit 306-1 to 306-3 (which generally resides in the touch screen interface 206 of the touch screen controller 204 and which also generally includes drivers to assist in sourcing current through the respective column electrodes), and coupled to each row electrode 304-1 to 304-5 is a touch detection circuit 308-1 to 308-5 (which generally resides in the touch screen interface 206 of the touch screen controller 204 and which also generally includes drivers and switches to assist in sourcing current through the respective row electrodes). By configuring the touch screen 202 and touch screen interface 206 as shown, the touch screen 202 can be better controlled; specifically, the signal processing circuit of touch screen controller 204 (which can generally comprise zone controller 212, touch engine 208, multi-touch controller 210 and host interface 216 to a host processor 226) is able to coarsely determine the "zone" of a touch event and finely resolve the position within the zone using the circuitry shown in FIG. 4 and the state diagram of FIG. 5.

Initially, in state 502, the signal processing circuit is at an idle state. While in state 502, the signal processing circuit can perform a precharge and sensing operation to determine whether a touch event (anywhere on the touch screen 202 has occurred). This is typically done by activating (with the multi-touch controller 210) all switching circuits 306-1 to 306-3 and all touch detection circuits 308-1 to 308-5 or by repeatedly scanning through the switching circuits 306-1 to 306-3 and touch detection circuits 308-1 to 308-5. This allow for coarse identification of the "zone" or intersecting row and column electrodes having a touch event. This zone can then be stored in the index register 408 of the host interface 216.

When the zone for a touch event has been identified, the characteristics of the touch can be resolved. Specifically, in state 504, the signal processing circuit (by way of the zone controller 212 and multi-touch controller 210) can perform a precharge and sensing operation for the column associated with the identified zone. Typically, the signal processing circuit activates or applies as voltage (i.e., voltage V) across the column electrode (i.e., 302-1) associated with the zone.

Figure 6A:
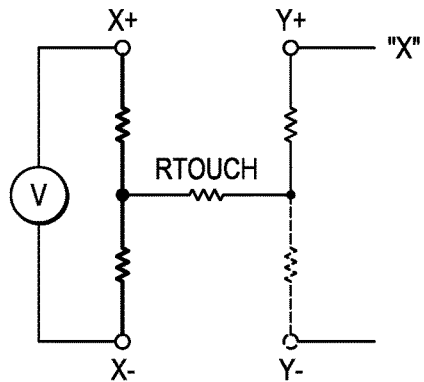
FIG. 6A-6D are various approaches to measuring resistances at different touches.
Figure 6B:
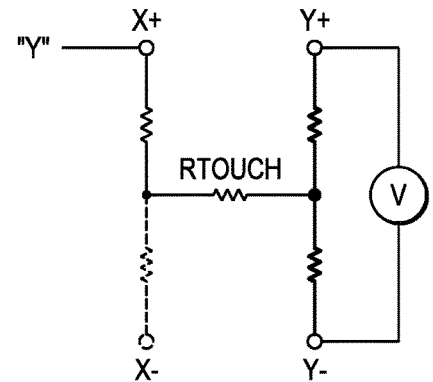

As shown in FIG. 6B, a resistance measurement is performed by the touch detection circuit (i.e., 308-1) associated with the zone. This strip resistance $R_Y$ (which corresponds to the associated column) can be converted by ADC 402, touch engine controller 404, and pre-processing circuit 214 in state 506 to a digital representation of the vertical (or "Y") coordinate within the identified zone, which can be stored in data register 406 in state 516.

Then, in state 508, the signal processing circuit can perform a precharge and sensing operation for the row associated with the identified zone. Typically, the signal processing circuit activates or applies as voltage (i.e., voltage V) across the row electrode (i.e., 304-1) associated with the zone As shown in FIG. 6A, a resistance measurement is performed by the touch detection circuit (i.e., 308-1) associated with the zone. This strip resistance $R_X$ (which corresponds to the associated row) can be converted by ADC 402, touch engine controller 404, and pre-processing circuit 214 in state 510 to a digital representation of the horizontal (or "X") coordinate within the identified zone, which can be stored in data register 406 in state 516. In some circumstances (i.e., where no pressure measurement is desired), state 516 can be entered from state 510.

In instances where a pressure measurement is desired, the pressure (or "Z" coordinate) can be determined in states 512 and 514 and stored in the data register 406 in state 516. (after a determination that there has been no change in the zone in state 512). To do this, two resistance measurements are made.

Figure 6C:
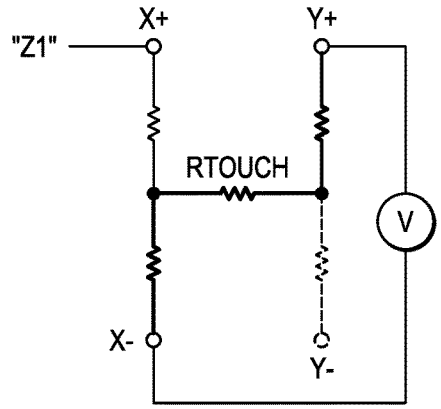
Figure 6D:
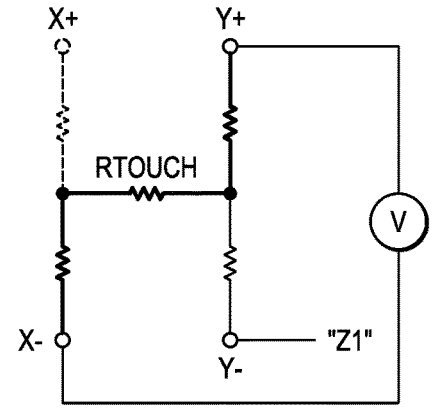

As shown in FIGS. 6C and 6D, a voltage V is applied across the positive terminal for the column electrode associated with the identified zone (i.e., 302-1) and the negative terminal for the row electrode associated with the identified zone (i.e., 304-1). The first pressure-related resistance measurement Z1 is then determined from the positive terminal for the row electrode associated with the identified zone (i.e., 304-1), and the second pressure-related resistance measurement Z2 is determined from the negative terminal for the column electrode associated with the identified zone (i.e., 302-1). With these resistance measurements, the touch resistance RTOUCH can be calculated as follows:

$$RTOUCH = R_X \frac{X}{4096}\left(\frac{Z2}{Z1} - 1\right); \quad (1)$$

or $$RTOUCH = R_X \frac{X}{4096}\left(\frac{4096}{Z1} - 1\right) - R_Y\left(1 - \frac{Y}{4096}\right), \quad (2)$$

where X is the horizontal position or coordinate within the identified zone, Y is the vertical position or coordinate within the identified zone, $R_X$ and $R_Y$ are the strip resistances, and Z1 and Z2 are the pressure-related resistance measurements. The touch resistance RTOUCH is proportional to the pressure applied to the touch screen, so the ADC 402, touch engine controller 208, and pre-processing circuit 214 in state 514 can both calculated the touch resistance RTOUCH and pressure, which can be stored in data register 406 in state 516.

Following the of the update of the data register 406 with the pressure (or "Z") coordinate, the signal processing circuit can perform a precharge and sensing operation to determine whether a touch event anywhere else on the touch screen 202 has occurred in state 518. States 504 to 516 can then be repeated for additional touch events other zones. Additionally, because interaction with a touch screen 202 in interactive, touch events change, as, for example, fingers are moved across the touch screen, the state diagram includes several state changes reflecting these types of changes. With most of the state changes, the columns and/or row can be switched or cycled (i.e., activations of successive columns electrodes 302-1 to 302-3 and/or row electrodes 304-1 to 304-5).

Thus, by using the system 200, several benefits can be realized. First, power consumption can be reduced over that of system 100. Second, multi-touch capability (i.e., between difference zone) can be realized without the use of more exotic algorithms.

Figure 7:
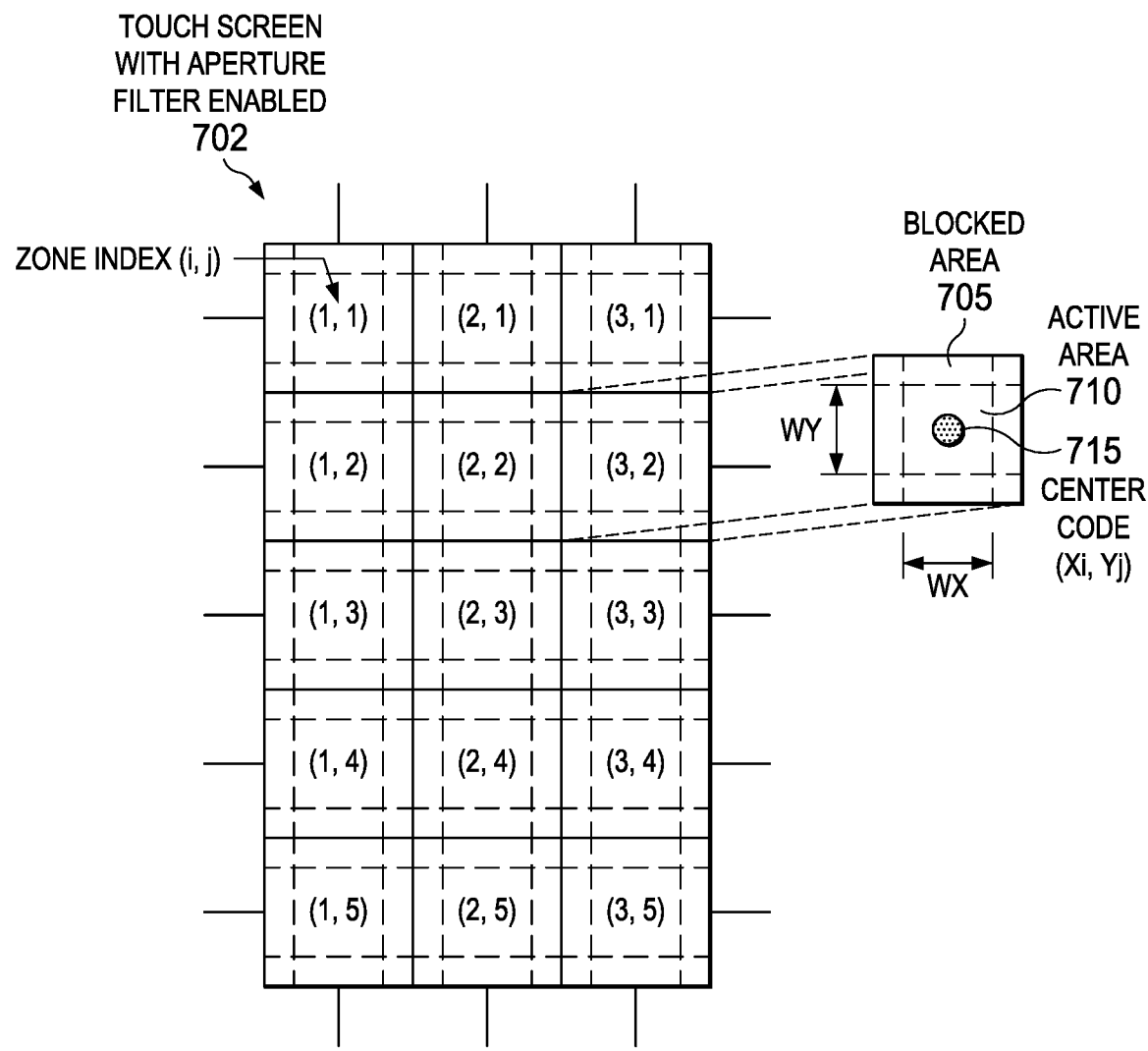
FIG. 7 illustrates a touch screen with aperture filter.

FIG. 7 illustrates a touch screen with aperture filter 702. As is illustrated, there is a blocked area 705 and an active area 710. Each aperture has its own way of being identified 715.

Generally, the touch screen 202 addresses problems with distortions were from the resistive loops that link row and column resistances with the touch resistances caused by multiple touched zones and were also from the nonlinear resistance at the edges of touch sensors. These distortions can be efficiently removed by this aperture filter. The touch screen with aperture filter uses the sensor zone indices and the configurable aperture windows to filter out the distortions at touched sensors. The configurable aperture window size can be adjusted after the touch panel calibration to meet optimal filtering effects.

It can eliminate the confusing coordinate sets created by these distortions at the real time while the coordinate sets are generated. It can also create invalid touch zones by setting the aperture window sizes to 0 for the sensors located at undesired rows and columns.

FIG. 8A illustrates a center code definition. As is illustrated, each zone index (i, j) has a different center code (Xi, Yj). The center codes are being calculated during the calibration procedure as illustrated in FIG. 8E.

FIG. 8B illustrates an aperture filter register page. The bits [15:12] represents an internal address where the aperture configuration data will be stored. The center codes Xi and Yj are stored in a 12-bit data format. The aperture window size in X direction (WX) and the aperture window size in Y direction (WY) are configurable to make apertures dilate or contract. Separate window sizes for different apertures are plausible and achievable.

Use of these center codes and the aperture window sizes (WX and WY) enables the aperture filter of the system 200 to determine whether the position a touch occurs with is inside the active area 710.

Figure 8C:
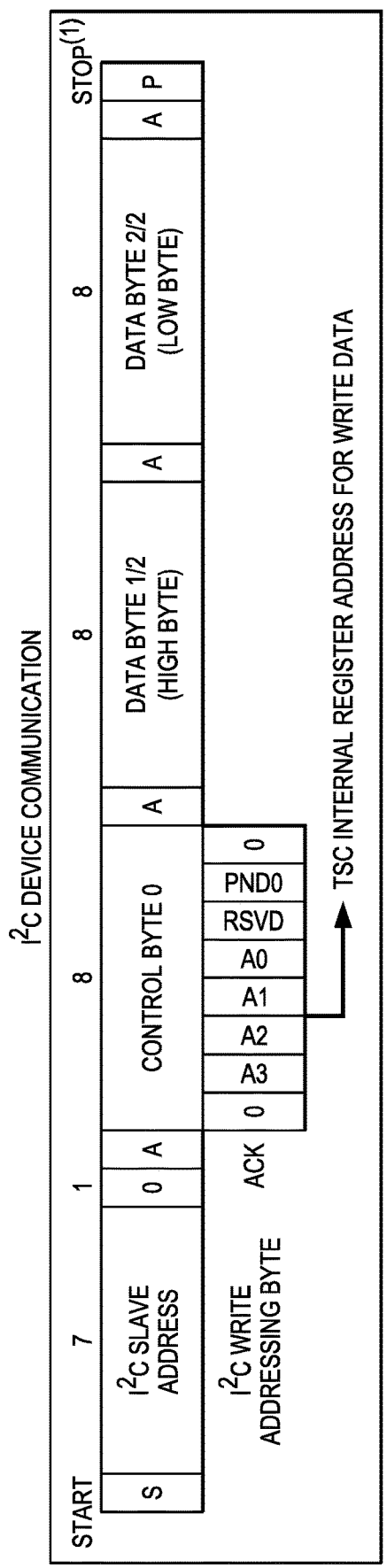
FIG. 8C illustrates an I2C device communication protocol used to convey commands of storing aperture configuration from a host Processor 226 of FIG. 2 to the aperture filter register page.
Figure 8E:
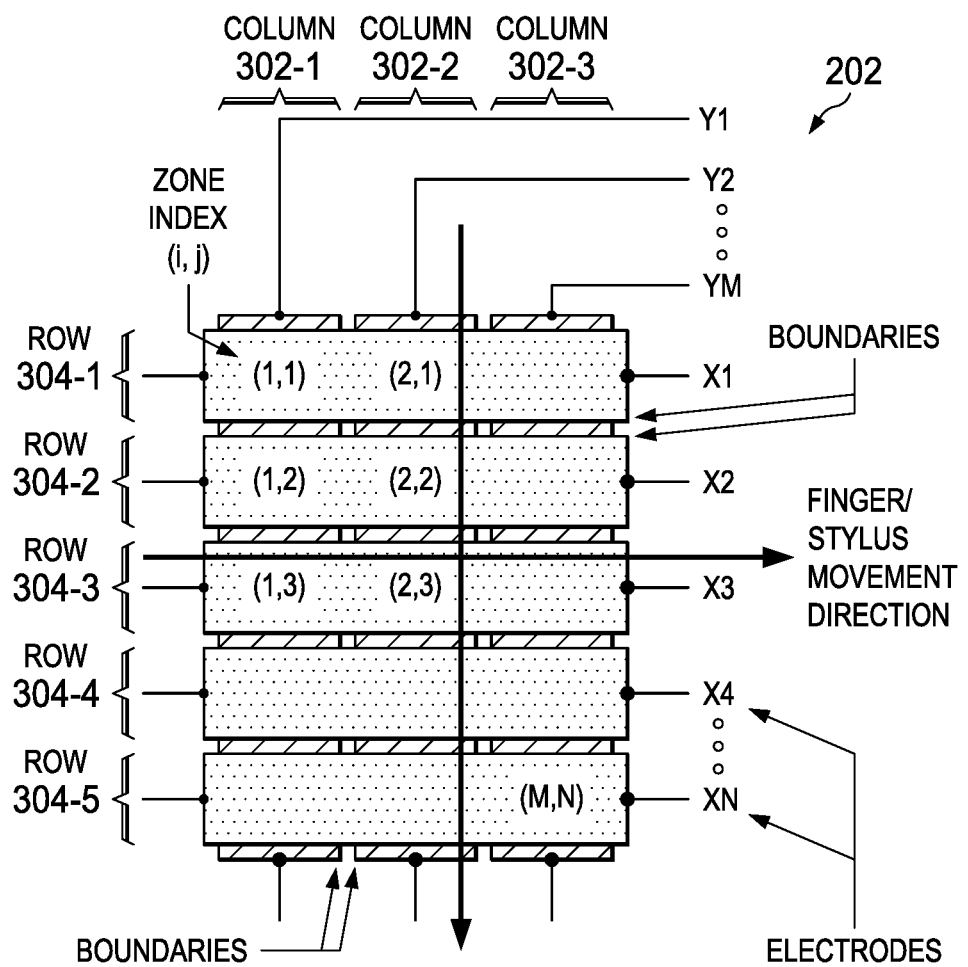
FIG. 8E illustrates a method to calibrate aperture areas on a touch screen with multiple touch zones, wherein a finger/stylus is crossing a touch screen.

FIG. 8C illustrates an I2C device communication protocol. I2C refers to one of serial bus data transfer interface but is not limited to the only bus interface that can be implemented in the system 200. Therefore, these communication bits can be used to configure apertures and enable or disable the aperture filter. This is embodied in the host interface 216.

FIG. 8D illustrates an internal register map used to configure all the different blocks of the Touch Screen Controller 204 and also to store result data, such as zone index, X, Y, Z1 and Z2 coordinates. The result data can be read out from the host processor 226 through I2C communication protocol. One example is that the host processor 226 sets D13 bit in the Configuration Register 0 (CFR0) as shown in FIG. 8D to enable the aperture filter.

FIG. 8E illustrates a method to calibrate aperture areas on a touch screen with multiple touch zones, wherein a finger/stylus is crossing a touch screen 202. While drawing the line across Row 304-3, Host Processor 226 collects the zone index, X, and Y coordinate sets of the touches and compares the index of the current coordinate set with the index of the previous coordinate set. When these indices change from (i−1, j) to (i, j), Host Processor 226 stores X coordinate of the previous coordinate set as the right-hand-side boundary coordinate of the last zone (i−1, j); the X coordinate of the current coordinate set as the left-hand-side boundary coordinate of the current zone (i, j). Once the right-hand-side boundary coordinate of the current zone (i, j) along the horizontal calibration line is found, the coordinate Xi of the center code of the current zone (i, j) can be calculated and stored into Aperture Filter Register Page as illustrated in FIG. 8B. While drawing the line across Column 302-2, Host Processor 226 collects the zone index, X, and Y coordinate sets of the touches and compares the index of the current coordinate set with the index of the previous coordinate set. When these indices change from (i, j−1) to (i, j), Host Processor 226 stores Y coordinate of the previous coordinate set as the bottom-side boundary coordinate of the last zone (i, j−1); the Y coordinate of the current coordinate set as the top-side boundary coordinate of the current zone (i, j). Once the bottom-side boundary coordinate of the current zone (i, j) along the vertical calibration line is found, the coordinate Yj of the center code of the current zone (i, j) can be calculated and stored into Aperture Filter Register Page.

Figure 9:
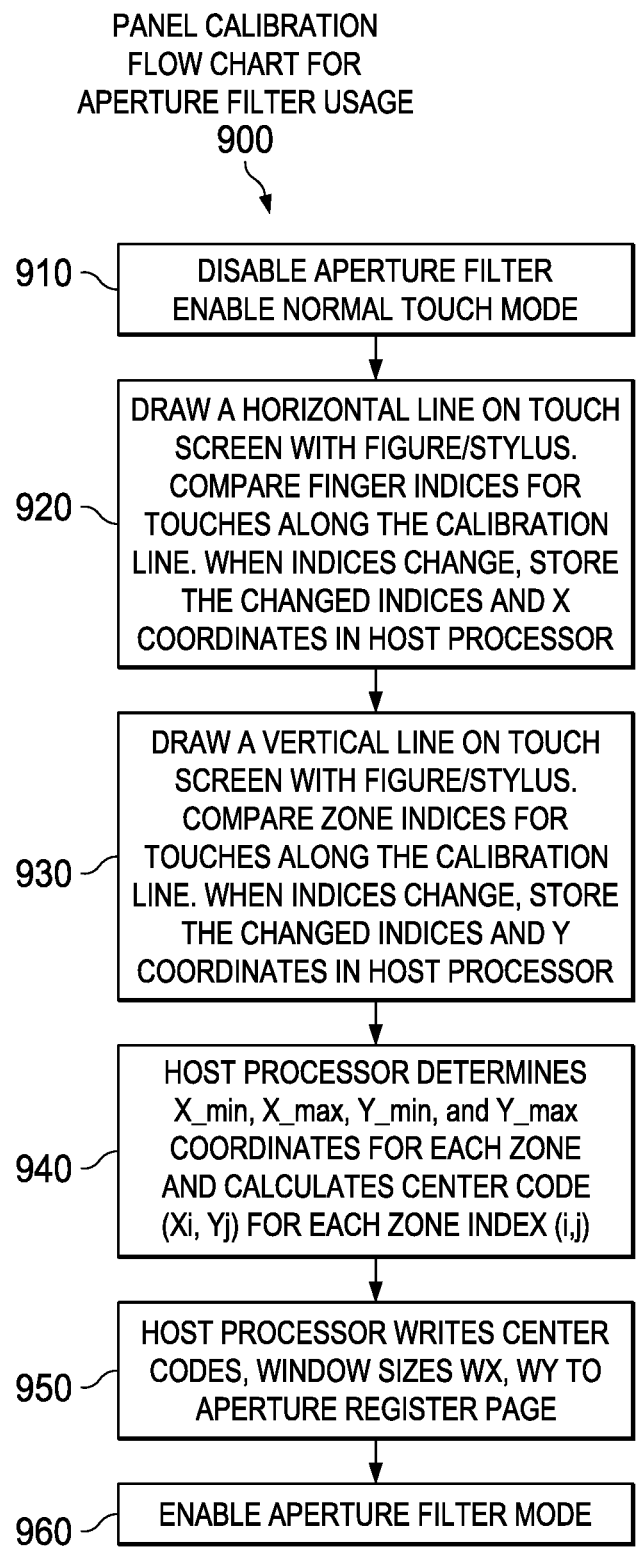
FIG. 9 illustrates a process for calibrating aperture areas for the aperture filter, such as may be used in a multi-touch controller of FIG. 2.

FIG. 9 illustrates a process 900 for calibrating aperture areas for the aperture filter, such as the aperture of FIG. 8A as embodied in the touch screen 202 and the control of the multi-touch controller 210.

In a step 910, the aperture filter is disabled, and a normal touch mode is enabled.

In a step 920, a horizontal line is drawn on the touch screen 202 with finger/stylus, wherein these zone indices are compared. When indices change, the changed indices and X coordinates are stored in a host processor 226.

In a step 930, a vertical line is drawn on the touch screen 202 with finger/stylus, wherein these zone indices are compared. When indices change, the changed indices and Y coordinates are stored in a host processor 226.

In a step 940, the host processor 226 determines X_min, X_max, Y_min, and Y_max coordinates for each zone and calculates the center codes 715 (Xi, Yj) for each zone index (i, j). The X_min, X_max, Y_min and Y_max coordinates define the zone edges. A center code for the zone (i, j) can be calculated as: Xi=(Xi_max−Xi_min)/2+Xi_min; Yj=(Yj_max−Yj_min)/2+Yj_min.

In a step 950, the host processor 226 writes the center codes, and window sizes, WX, WY to the Aperture Register Page in Host Interface 216, such as in FIG. 8B.

In a step 960, the aperture filter mode is enabled, such as by writing to an internal configuration register.

The configurable aperture window size can be adjusted after the touch screen calibration to meet optimal filtering effects.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a touch screen having column electrodes and row electrodes, the column electrodes and the row electrodes forming sensor zones having respective sensor zone indices;
   a touch screen controller coupled to the column electrodes and the row electrodes, the touch screen controller comprising a signal processing circuit; and
   an aperture filter coupled to the signal processing circuit, the aperture filter having spatial aperture windows respectively aligned with the sensor zones, each spatial aperture window having a respective adjustable spatial aperture window size along an X-axis and along a Y-axis, the aperture filter configured to filter distortions from the touch screen according to the sensor zone indices and the spatial aperture window sizes.

2. The apparatus of claim 1, wherein the touch screen controller comprises an aperture register configured to store data for adjusting the spatial aperture window sizes.

3. The apparatus of claim 1, wherein the aperture filter is configured to invalidate a particular sensor zone by setting the particular sensor zone's respective spatial aperture window size to zero.

4. The apparatus of claim 1, wherein the X-axis is an X-axis of the touch screen, and the Y-axis is a Y-axis of the touch screen.

5. The apparatus of claim 1, wherein the touch screen controller comprises a touch screen interface, and the signal processing circuit comprises:
   a multi-touch controller coupled to the touch screen interface; and a touch engine coupled to the touch screen interface and the multi-touch controller.

6. The apparatus of claim 5, wherein the signal processing circuit comprises a host interface coupled to the touch engine.

7. The apparatus of claim 5, wherein the signal processing circuit comprises a host interface, and the touch engine comprises:
- an analog-to-digital converter (ADC) coupled to the touch screen interface;
- a touch engine controller coupled to the multi-touch controller, the ADC, and the host interface; and
- a pre-processing circuit coupled to the touch engine controller and the host interface.

8. The apparatus of claim 7, wherein the host interface comprises:
- an index register configured to store a particular sensor zone index for a touch event; and
- a data register configured to store digital representations of first and second resistances for the touch event.

9. The apparatus of claim 7, wherein the host interface comprises an inter-integrated circuit (I2C) interface.

10. A method for calibrating and operating a touch screen device having a touch screen and an aperture filter, the touch screen having zones identified by respective zone indices, the method comprising:
- disabling the aperture filter;
- after disabling the aperture filter, enabling a normal touch mode of the touch screen device;
- storing first coordinates at which the zone indices change, responsive to touches along an X-axis of the touch screen;
- storing second coordinates at which the zone indices change, responsive to touches along a Y-axis of the touch screen;
- responsive to the first and second coordinates, determining respective maximum and minimum coordinates for each zone, and calculating a respective center code for each zone index;
- in an aperture page register, storing the respective center code and a respective spatial aperture window size for each zone, the respective spatial aperture window size comprising a respective size along the X-axis and a respective size along the Y-axis; and
- after storing the center codes and the spatial aperture window sizes, enabling the aperture filter.

11. The method of claim 10, further comprising adjusting one or more of the spatial aperture window sizes.

12. The method of claim 10, wherein the maximum and minimum coordinates comprise maximum and minimum coordinates along the X-axis and along the Y-axis.

* * * * *